(12) United States Patent
Zengel

(10) Patent No.: US 6,548,946 B1
(45) Date of Patent: Apr. 15, 2003

(54) ELECTRON BEAM GENERATOR

(75) Inventor: Thomas Orrin Zengel, Mason, OH (US)

(73) Assignee: General Electric Company, Schenectady, NY (US)

( * ) Notice: Subject to any disclaimer, the term of this patent is extended or adjusted under 35 U.S.C. 154(b) by 237 days.

(21) Appl. No.: 09/704,923

(22) Filed: Nov. 2, 2000

(51) Int. Cl.⁷ .................... H01J 17/26; H01J 61/28
(52) U.S. Cl. .............. 313/231.01; 313/359.1; 313/362.1; 313/231.01; 313/231.31; 118/723 EB; 118/723 VE; 118/723 HC; 315/111.81; 315/111.91
(58) Field of Search .......... 313/231.01–231.71, 313/237, 238, 359.1, 362.1, 452; 315/111.81, 111.91; 118/723 EB, 723 VE, 723 HC, 723 DC

(56) References Cited

U.S. PATENT DOCUMENTS

| | | | | |
|---|---|---|---|---|
| 3,187,216 A | * | 6/1965 | Sciaky | 219/121.13 |
| 4,687,902 A | * | 8/1987 | Colegrove et al. | 219/121.27 |
| 4,803,398 A | * | 2/1989 | Kraft et al. | 313/237 |
| 4,900,982 A | * | 2/1990 | Kolpin | 313/146 |
| 6,252,339 B1 | * | 6/2001 | Kendall | 219/121.12 |

* cited by examiner

Primary Examiner—Nimeshkumar D. Patel
Assistant Examiner—German Colón
(74) Attorney, Agent, or Firm—David L. Narciso; Gary M. Hartman; Domenica N. S. Hartman

(57) ABSTRACT

An electron beam generator having circuit interconnections between individual components that are less prone to the adverse effects of thermal cycling. The generator includes a conductor rod within a guide tube, a center conductor secured to one end of the rod, and an outer conductor secured to the adjacent end of the guide tube. An opposite end of the center conductor has an integrally-formed flange extending radially therefrom. A first tower is secured and electrically connected to the flange, while a second and adjacent tower is electrically connected to the outer conductor. A filament is mounted to and between the first and second towers. A forward leg of the filament circuit comprises the conductor rod, the center conductor, the flange and the first tower, and the return leg of the filament circuit comprises the second tower and the guide tube interconnected by the outer conductor.

20 Claims, 2 Drawing Sheets

ELECTRON BEAM GENERATOR

FIELD OF THE INVENTION

This invention generally relates to electron beam generators, particularly of the type used in electron beam physical vapor deposition apparatuses to deposit ceramic coatings. More particularly, this invention is directed to an electron beam generator that exhibits improved service life at high operating temperatures.

BACKGROUND OF THE INVENTION

Electron beam physical vapor deposition (EBPVD) is a well-known process for producing ceramic coatings, such as thermal barrier coatings (TBC) for the high-temperature components of gas turbine engines. Various ceramic materials have been used as TBC's, particularly zirconia ($ZrO_2$) stabilized by yttria ($Y_2O_3$), magnesia (MgO) or other oxides. Advantageously, TBC's can be deposited by EBPVD to have a columnar grain structure that is able to expand with its underlying substrate without causing damaging stresses that lead to spallation, and therefore exhibits enhanced strain tolerance.

Processes for producing TBC by EBPVD generally entail heating a component to be coated to a temperature of about 1000° C. or more within a partially evacuated coating chamber. During coating, the component is supported above an ingot of the ceramic coating material (e.g., YSZ), and an electron beam generated by an electron beam (EB) gun is projected onto the ingot to melt the surface of the ingot and produce a vapor of the coating material. The vapor then travels upward toward the component and condenses on the component surface to form the desired coating. In order to melt ceramic materials such as YSZ, electron beam guns must be operated at a high voltage (e.g., 35 kV) and power level (e.g., 50 to 120 kW). The EB gun component that produces the electron beam is a beam generator. FIG. 1 represents a generator 110 that is commercially available from ALD Vacuum Technologies, Inc., of East Windsor Conn., USA. The generator 110 has a primary cathode (filament) 140 which produces an electron flux that heats a primary tungsten anode (block) 148 to about 2000° C. The block 148 then serves as a secondary cathode to an external secondary anode (not shown), by which the tungsten block 148 emits an electron beam due to a high voltage between it and the secondary anode. If any connection in the circuit containing the filament 140 becomes resistive due to oxidation, or mechanically opens due to thermal stress, or both, the beam generator 110 ceases to emit, stopping evaporation and terminating the coating process.

The filament circuit contains several bimetallic contacts in close proximity to the hottest section of the generator 110. The two metals most widely used are copper and molybdenum, the former for its electrical and thermal conductivity and the latter for its high melting point and stability at high temperatures. For example, a conductor rod 112 that delivers current to the filament 140 is most often copper. A molybdenum ion catcher 128 has a first end 130 threaded into a bore 126 of the conductor rod 112, by which a molybdenum spacer 124 is secured to the rod 112. A first molybdenum filament tower 138 is then secured and electrically connected to the spacer 124 with a threaded stud 160 and copper nut 162, which clamps a disk-shaped insulator 166 between the spacer 124 and tower 138. A second molybdenum filament tower 139 is secured with a second stud and nut assembly 160/162 to the insulator 166, between which is clamped a molybdenum mounting plate 164. As such, both of the filament towers 138 and 139 are secured in place as a result of the spacer 124 being secured to the rod 112 with the ion catcher 128. The rod 112, spacer 124, ion catcher 128 and filament tower 138 constitute a forward leg of the filament circuit. Because of their high temperature environment, the threaded connections can loosen and oxidize during operation due to differing expansion and heat conduction of the two metals. If the ion catcher 128 becomes loose and releases the spacer 124, the filament circuit opens and the generator 110 cannot be restarted.

The filament tower 139, a molybdenum cap 144, the molybdenum mounting plate 164, a copper fitting 142 and a copper guide tube 134 constitute the return leg of the filament circuit. The molybdenum cap 144 is threaded onto the copper fitting 142, which is brazed or otherwise permanently attached to the copper guide tube 134 surrounding the conductor rod 112. The cap 144 clamps the mounting plate 164 to the fitting 142 to complete the filament circuit between the tower 139 and the guide tube 134. Consequently, if the cap 144 loosens, the filament circuit is open and the generator 110 ceases operating. The threads of the fitting 142 can distort at the high operating temperatures of the generator 110. In addition, the threaded portion of the cap 144 may bell and crack during extended operation of the generator 110. If the clamping action between the cap 144 and fitting 142 is lost, the filament circuit opens, again with the result that the generator 110 shuts down and cannot be restarted.

In view of the above, it can be appreciated that improved service life for an EB gun could be obtained if the reliability of the EB generator 110 mechanical connections could be improved. However, any change in the mechanical design of the generator 110 must be made carefully and tested with caution due to the very high operating voltages, power levels, amperage and operating temperatures involved.

BRIEF SUMMARY OF THE INVENTION

The present invention is an electron beam generator of the type used in an EBPVD apparatus. A feature of the generator is that critical interconnections between individual components are made less prone to the adverse effects of thermal cycling.

The generator of this invention generally includes a conductor rod within a guide tube, generally as done in the prior art. However, the adjacent ends of both the conductor rod and guide tube are configured differently for purposes of the invention. The end of the conductor rod is modified to accept one end of a center conductor member. The opposite end of the center conductor member is formed to have an integrally-formed flange extending radially therefrom. An outer conductor member is secured to the adjacent end of the guide tube. A first tower is secured and electrically connected to the flange of the center conductor member, while a second tower is adjacent the first tower and electrically connected to the outer conductor member. A filament is mounted to and between the first and second towers, and a member is positioned adjacent to the filament for generating an electron beam when a sufficient current is applied to the filament via the conductor rod, the center conductor member, the flange and the first tower, which constitute a forward leg of the filament circuit. A return leg of the filament circuit includes the second tower and the guide tube, interconnected by the outer conductor member.

An important feature of the invention is the elimination of the discrete spacer 124 between the ion catcher 128 and the conductor rod 112 of the prior art generator 110 of FIG. 1. Instead, the function of the spacer 124 is performed by the integral flange of the center conductor member, which serves as an intermediate connector between the first tower and the conductor rod. By eliminating the need for a discrete spacer and therefore the possibility of it loosening, the center conductor member is able to considerably reduce the possibility of an open circuit occurring between the ion catcher and the conductor rod as compared to the prior art generator 110.

According to one aspect of the invention, at least one and preferably each of the center conductor member, first and second towers, outer conductor member and cap are formed of stainless steel, instead of the conventional molybdenum. As a result, the differences in coefficient of thermal expansion are less between the stainless steel components and the conventional copper components, as compared to that between the conventional molybdenum and copper components of the prior art.

According to another aspect of the invention, the second tower is preferably secured and electrically connected to the outer conductor member by a mounting member, which in turn is clamped to the outer conductor member. The mounting member is preferably clamped to the outer conductor member with a cap that is secured to the outer conductor member by a camming feature, instead of being secured with threads directly to the guide tube. As a result, another benefit of the invention is the reduced likelihood of an open filament circuit occurring as a result of thread distortion between the cap 144 and fitting 142 of the prior art generator 110 of FIG. 1.

Other objects and advantages of this invention will be better appreciated from the following detailed description.

DETAILED DESCRIPTION OF THE INVENTION

Figure 1:
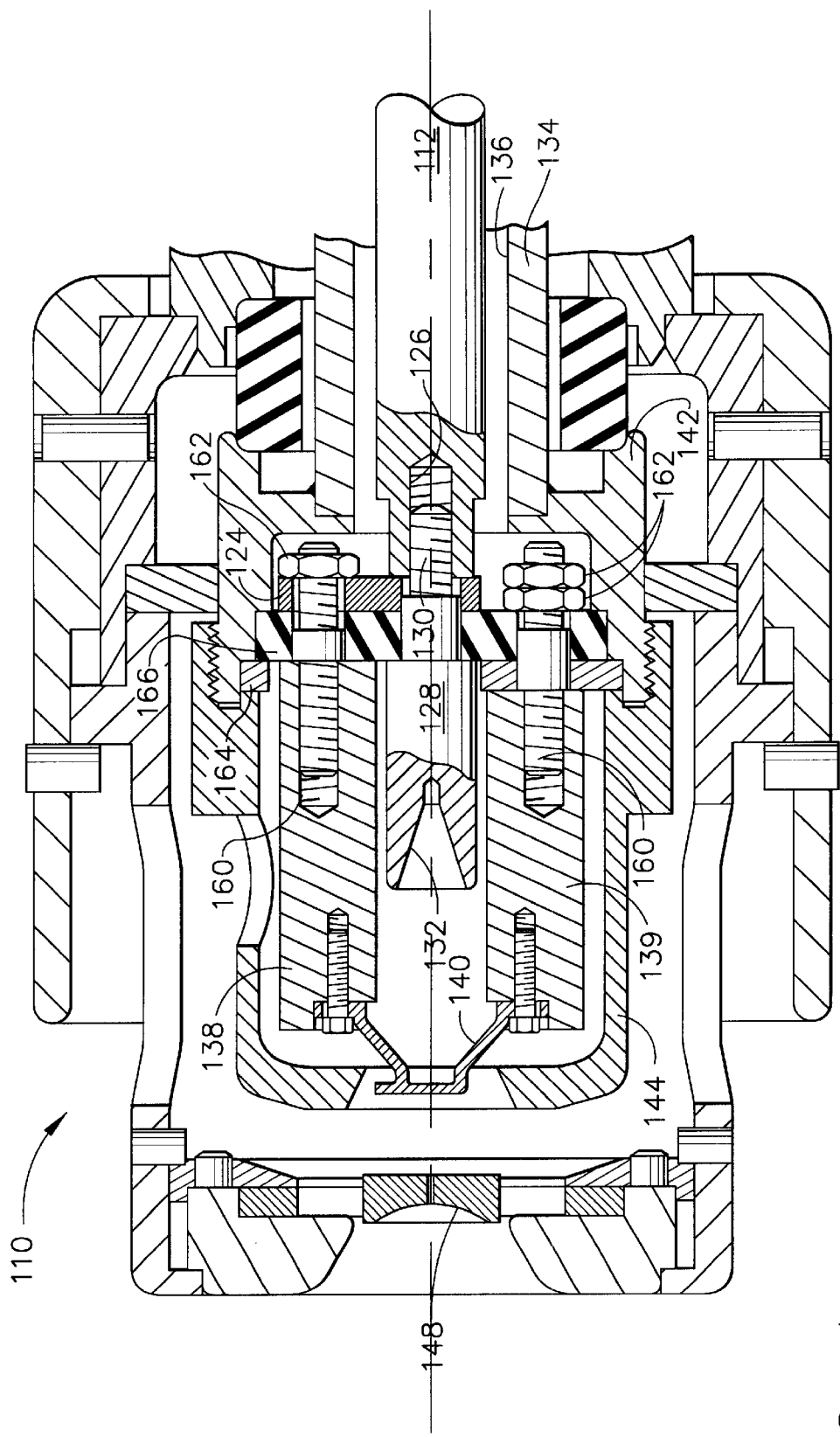
FIG. 1 is a longitudinal sectional through an electron beam generator in accordance with the prior art.
Figure 2:
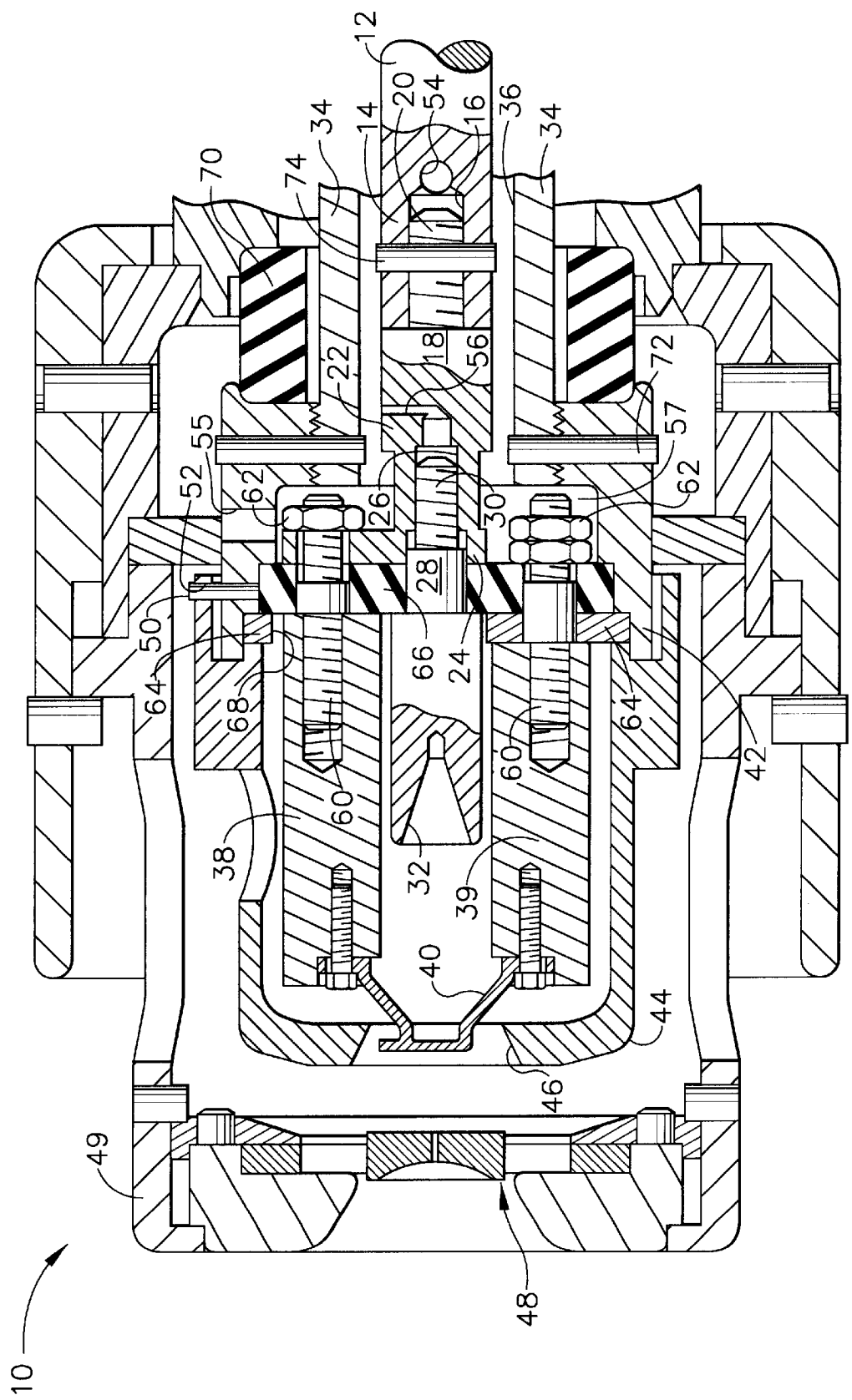
FIG. 2 is a longitudinal sectional through an electron beam generator in accordance with the present invention.

An electron beam generator 10 in accordance with this invention is represented in FIG. 2. The generator 10 is of a type particularly suited for use in an EB gun used in an EBPVD apparatus to deposit a ceramic thermal barrier coating on a metal component intended for operation within a thermally hostile environment. Notable examples of such components include the high and low pressure turbine nozzles and blades, shrouds, combustor liners and augmentor hardware of gas turbine engines. While the advantages of this invention will be described with reference to depositing a ceramic coating, the teachings of this invention can be generally applied to the deposition by EBPVD of a variety of coating materials. For purposes of illustrating the invention, the generator 10 is shown in FIG. 2 as including components that are similar or identical to the components of the prior art generator 110 represented in FIG. 1. Components common to each generator will be indicated, as well as those components unique to the present invention.

As with the generator 110 of FIG. 1, the generator 10 of this invention is configured to have primary and secondary cathodes. The primary cathode is a filament 40, while the primary anode is a block 48 that also serves as a secondary cathode to an external secondary anode (not shown). A current of about 40 to 60 amps passes through the filament 40 during operation, and a potential of about 3 kV is established between the filament 40 and the block 48. The potential between the block 48 and the external secondary anode is about 35 kV. When the block 48 is heated to a certain temperature by the electron flux from the filament 40, the block 48 emits an electron beam of considerable power (on the order of hundreds of kilowatts) due to the potential between the block 48 and the external secondary anode. The electron beam is then contained, focused and steered by magnetic fields.

The electron beam generator 10 includes a conductor rod 12 disposed within an axial passage 36 of a guide tube 34. Both the conductor rod 12 and guide tube 34 may be formed of copper, as conventional in the prior art. An important difference is that the rod 12 and tube 34 are both truncated as compared to the rod 112 and tube 134 of the prior art generator 110. Specifically, the tube 34 does not include a permanent threaded copper fitting 142, and the distal end 14 of the conductor rod 12 terminates well short of the end of the tube 34. As will become apparent from the above and a comparison of FIGS. 1 and 2, an advantage of the present invention is the possibility of fabricating the conductor rod 12 and tube 34 of the generator 10 from a rod 112 and tube 134 that were salvaged from an otherwise scrapped prior art generator 110.

A threaded bore 16 is formed in the distal end 14 of the rod 12, which receives a threaded end 20 of a generally cylindrically-shaped center conductor member 18. A suitable material for the center conductor member 18 is a stainless steel, such as Type 303, though it is foreseeable that other high-temperature materials could be used. The end 20 of the center conductor member 18 is shown as being threaded into the bore 16 and then further secured with a pin 74. A hole 54 is formed in the rod 12 to allow outgassing of the bore 16 as the generator 10 is evacuated and the temperature of the generator 10 increases during startup.

The opposite end 22 of the center conductor member 18 has an integrally-formed flange 24 that extends in a radial direction from the conductor 18. Notably, the flange 24 eliminates the separate molybdenum spacer 124 required by the prior art generator 110 of FIG. 1. A threaded bore 26 is formed in the end 22 of the conductor 18, into which is threaded one end 30 of an ion catcher 28. The opposite end of the ion catcher 28 is formed to have a tapered recess 32, which serves to capture ions returning to the generator 10 via the electron beam. Because the ion catcher 28 is separated from the copper rod 12 by the center conductor member 18, the ion catcher 28 can be conventionally formed of molybdenum without concern for the CTE mismatch between molybdenum and copper. As with the conductor rod 12, an outgassing hole 56 is provided in the center electrode 18 to allow outgassing between the center conductor member 18 and the ion catcher 28 during pumpdown and start up of the generator 10.

A first filament tower 38 and an insulator plate 66 are secured to the flange 24 of the center conductor member 18 with a stud 60 and nut 62. The insulator plate 66 can be seen in FIG. 2 as having a center portion disposed between the ion catcher 28 and the center conductor member 18, and a lateral portion that extends in an opposite direction to the flange 24. A second filament tower 39 is secured to the lateral portion of the insulator plate 66, between which is sandwiched a mounting plate 64. The mounting plate 64 is shown in FIG. 2 as having an opening 68 through which the ion catcher 28 and the first filament tower 38 are attached directly to the insulator plate 66 so as not to contact the mounting plate 64.

Together, the mounting plate 64 and the insulator plate 66 serve as a rigid base for the second tower 39, while the insulator plate 66 further provides electrical insulation between the first tower 38 and the center conductor member 18, its flange 24, and an outer conductor member 42 (described below). A suitable material for the mounting plate 64 is molybdenum, though it is foreseeable that a stainless steel can be used. A suitable material for the insulator plate 66 is alumina ($Al_2O_3$). The towers 38 and 39 are positioned to surround the end of the ion catcher 28 in which the tapered recess 32 is formed. As with the center conductor member 18, a suitable material for the filament towers 38 and 39 is a stainless steel, such as Type 303, though it is foreseeable that other high-temperature materials could be used. Furthermore, because of their critical function and their placement in the hottest part of the generator 10, molybdenum may be preferred as the material for the towers 38 and 39 in some coating applications. The studs 60 are preferably stainless steel for compatibility with the towers 38 and 39, while the nuts 62 may be copper or a stainless steel.

The filament circuit is completed with the filament 40, each end of which is secured to one of the towers 38 and 39. As is conventional, the filament 40 is axially aligned with the ion catcher 28, and is preferably formed of tungsten. Aside from the copper conductor rod 12 and the tungsten filament 40, the forward leg of the filament circuit is primarily formed by the steel center conductor member 18, steel flange 24, steel studs 60 and the steel filament tower 38, such that there is a significantly reduced concern for an open circuit caused by thermally-induced stresses and distortions. Even if the molybdenum ion catcher 28 were to become loose, the generator 10 would continue to function normally.

The first component in the return leg of the filament circuit is the second filament tower 39, which is electrically connected to the outer conductor member 42 through the mounting plate 64. The mounting plate 64 is clamped to the outer conductor member.42 with a cap 44 that surrounds the filament towers 38 and 39 and has an axial opening 46 in which a distal portion of the filament 40 is received. The outer conductor member 42 is shown as surrounding the end 22 of the center conductor member 18 with the flange 24, and being threaded onto the guide tube 34 and secured with a pin 72. As with the center conductor member 18, flange 24, studs 60 and towers 38 and 39, suitable materials for the cap 44 and the outer conductor member 42 are stainless steels, such as Type 303, though it is foreseeable that other high-temperature materials could be used. The return leg of the filament circuit is thus primarily formed by the second steel tower 39, the mounting plate 64 and the steel outer conductor member 42, against which the mounting plate 64 is clamped by the steel cap 44 such that there is a significantly reduced concern for an open circuit caused by thermally-induced stresses and distortions.

FIG. 2 shows the cap 44 as being secured to the outer conductor member 42 with camming features (one of which is shown), each of which includes a pin 50 that extends radially outward from the outer conductor member 42 and engages a complementary camming slot 52 formed in the cap 44. Three sets of pins 50 and slots 52 are preferred, though it is foreseeable that fewer or more pin/slot sets could be used. The camming pins 50 and slots 52 replace the threads required by the cap 144 and fitting 142 of the prior art generator 110 shown in FIG. 1. The end of the outer conductor member 42 opposite the cap 44 is directly secured with threads and pins 72 to the guide tube 34. The outer conductor member 42 is preferably equipped with several vents 55 (one of which is shown in FIG. 2) for outgassing a cavity 57 defined between the outer conductor member 42 and the center conductor member 18. A cavity present between the fitting 142 and guide tube 134 of the prior art generator 110 is eliminated with the generator 10 by nesting an insulator 70 with the end of the outer conductor member 42 threaded onto the guide tube 34.

The final component of the generator 10 is the block 48 positioned adjacent the filament 40 by a suitable support frame 49. The block 48 shown in FIG. 2 is of a conventional type formed of tungsten, and serves as the anode to the primary cathode filament 40, as well as the secondary cathode to the external secondary anode (not shown). In the latter role, the block 48 is heated to a temperature of about 2000° C. or more by the electron flux from the filament 40, causing the block 48 to emit an electron beam due to the potential between the block 48 and the external secondary anode. For a coating operation in which the generator 10 is used to deposit a ceramic coating on one or more parts, the EB gun in which the generator 10 is installed is used to focus the beam on an ingot of the desired coating material. Heating of the ingot forms a molten pool of the ingot material and, with further heating, vapors that deposit on the parts. The coating operation continues until the desired thickness for the coating is obtained for the particular parts in question.

While the invention has been described in terms of a preferred embodiment, it is apparent that other forms could be adopted by one skilled in the art. Accordingly, the scope of the invention is to be limited only by the following claims.

What is claimed is:

1. An electron beam generator having a filament circuit that includes a filament, a forward leg to the filament, and a return leg from the filament, the electron beam generator comprising:

a guide tube having an axial passage;

a conductor rod disposed within the axial passage, the conductor rod having a distal end;

a center conductor member having a first end and an oppositely-disposed second end, the first end being secured to the distal end of the conductor rod, the second end having an integrally-formed flange extending radially therefrom;

a first tower secured and electrically connected to the flange of the center conductor member;

an outer conductor member secured to the guide tube;

a second tower adjacent the first tower and electrically connected to the outer conductor member;

the filament mounted to and between the first and second towers; and a member adjacent to the filament for generating an electron beam when a sufficient current is applied to the filament via the forward leg of the filament circuit that comprises the conductor rod, the center conductor member, the flange and the first tower, the return leg of the filament circuit comprising the second tower and the guide tube interconnected by the outer conductor member.

2. An electron beam generator according to claim 1, further comprising:

a mounting member to which the second tower is secured and electrically connected to the outer conductor member; and means for clamping the mounting member to the outer conductor member.

3. An electron beam generator according to claim 2, wherein the clamping means comprises a cap surrounding first and second towers and secured to the outer conductor member.

4. An electron beam generator according to claim 3, wherein the cap is secured to the outer conductor member by a camming feature comprising camming pins on the outer conductor member and engaged with complementary camming slots in the cap.

5. An electron beam generator according to claim 4, wherein the.camming pins extend radially from the outer conductor member.

6. An electron beam generator according to claim 1, wherein the conductor rod has an opening in the distal end thereof, the first end of the center conductor member being received in the opening.

7. An electron beam generator according to claim 6, wherein the conductor rod has a vent in the distal end thereof, the vent allowing for outgassing of the first end of the center conductor member received in the opening.

8. An electron beam generator according to claim 1, wherein the outer conductor member has at least one vent for outgassing a cavity defined between the outer conductor member and the center conductor member.

9. An electron beam generator, according to claim 1, wherein at least one of the center conductor member, the first and second towers, the outer conductor member, and the cap are formed of a stainless steel.

10. An electron beam generator according to claim 1, wherein the center conductor member, the first and second towers, the outer conductor member, and the cap are stainless steel.

11. An electron beam generator comprising:
 a copper guide tube having an axial passage;
 a copper conductor rod disposed within the axial passage, the conductor rod having a distal end defining an opening;
 a stainless steel center conductor member having a first end and an oppositely-disposed second end, the first end being secured within the opening in the conductor rod with threads and a pin, the second end having an integrally-formed flange extending radially therefrom and an axial bore therein;
 an ion catcher having a first end threaded into the bore of the center conductor member and an oppositely-disposed second end;
 an insulator member secured to the flange of the center conductor member;
 a conductive mounting plate secured to the insulator member;
 a first filament tower formed of a stainless steel and secured to the flange so as to be disposed adjacent to the second end of the ion catcher;
 a second filament tower formed of a stainless steel and secured to the mounting plate so that the second end of the ion catcher is between the first and second filament towers;
 a filament mounted to and between the first and second filament towers so as to be axially aligned with the second end of the ion catcher;
 a stainless steel outer conductor member surrounding the center conductor member and threaded and pinned to the guide tube;
 means for clamping the mounting plate to the outer conductor member to electrically connect the second filament tower via the mounting plate to the outer conductor member; and
 a member adjacent to the filament for generating an electron beam when a sufficient current is applied to the filament via the conductor rod, the center conductor member, the flange and the first filament tower.

12. An electron beam generator according to claim 11, wherein the clamping means comprises a stainless steel cap surrounding first and second filament towers and secured to the outer conductor member, the cap having an axial opening in which a portion of the filament is received.

13. An electron beam generator according to claim 12, wherein the cap is secured to the outer conductor member by a camming feature comprising camming pins on the outer conductor member and engaged with complementary camming slots in the cap.

14. An electron beam generator according to claim 13, wherein the camming pins extend radially from the outer conductor member.

15. An electron beam generator according to claim 11, wherein the conductor rod has at least one vent for outgassing the first end of the center conductor member received in the opening in the conductor rod.

16. An electron beam generator according to claim 11, wherein the outer conductor member has a vent for outgassing a cavity defined between the outer conductor member and the center conductor member.

17. An electron beam generator installed in an electron beam physical vapor deposition coating apparatus, the electron beam generator comprising:
 a copper guide tube having an internal axial passage and an external threaded portion at an end thereof;
 a copper conductor rod disposed within the axial passage, the conductor rod having a distal end defining a threaded opening;
 a stainless steel center conductor member having a first end and an oppositely-disposed second end, the first end being secured within the opening in the conductor rod with threads and a pin, the second end having an integrally-formed flange extending radially therefrom and a threaded axial bore therein;
 a molybdenum ion catcher having a first end threaded into the bore of the center conductor member and an oppositely-disposed second end;
 an insulator plate secured to the flange of the center conductor member, the insulator plate having a center portion disposed between the ion catcher and the second end of the center conductor member and a lateral portion oppositely disposed from the flange of the center conductor member;
 a conductive mounting plate secured to the insulator member, the mounting plate having an opening therein;
 a first filament tower formed of a stainless steel and secured to the flange and the insulator plate through the opening in the mounting plate, the first filament tower being disposed adjacent to the second end of the ion catcher;
 a second filament tower formed of a stainless steel and secured to the mounting plate so that the second end of the ion catcher is between the first and second filament towers;
 a tungsten filament mounted to and between the first and second filament towers so as to be axially aligned with the second end of the ion catcher;
 a stainless steel outer conductor member surrounding the center conductor member and threaded and pinned to the guide tube;
 a stainless steel cap surrounding the first and second filament towers and having an axial opening in which a portion of the filament is received, the cap being secured to the outer conductor member with camming means so as to clamp the mounting plate to the outer conductor member and electrically connect the second filament tower via the mounting plate to the outer conductor member; and a tungsten block adjacent to the filament for generating an electron beam when a sufficient current is applied to the filament via the conductor rod, the center conductor member, the flange and the first filament tower.

18. An electron beam generator according to claim 17, wherein the camming means comprising camming pins on the outer conductor member and engaged with complementary camming slots in the cap.

19. An electron beam generator according to claim 17, wherein the conductor rod has at least one vent for outgassing the first end of the center conductor member received in the opening in the conductor rod.

20. An electron beam generator according to claim 17, wherein the outer conductor member has a vent for outgassing a cavity defined between the outer conductor member and the center conductor member.

* * * * *